US012571847B2

(12) United States Patent
Kim

(10) Patent No.: US 12,571,847 B2
(45) Date of Patent: Mar. 10, 2026

(54) BATTERY PACK AND METHOD OF CONTROLLING THE SAME

(71) Applicant: LG Energy Solution, Ltd., Seoul (KR)

(72) Inventor: Tae Soo Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 686 days.

(21) Appl. No.: 17/920,268

(22) PCT Filed: Aug. 26, 2021

(86) PCT No.: PCT/KR2021/011405
§ 371 (c)(1),
(2) Date: Oct. 20, 2022

(87) PCT Pub. No.: WO2022/059957
PCT Pub. Date: Mar. 24, 2022

(65) Prior Publication Data
US 2023/0176135 A1 Jun. 8, 2023

(30) Foreign Application Priority Data
Sep. 16, 2020 (KR) ........................ 10-2020-0119503

(51) Int. Cl.
*G01R 31/3842* (2019.01)
*B60L 3/04* (2006.01)
(Continued)

(52) U.S. Cl.
CPC ............ *G01R 31/3842* (2019.01); *B60L 3/04* (2013.01); *B60L 50/60* (2019.02); *B60L 58/12* (2019.02);
(Continued)

(58) Field of Classification Search
CPC .............. G01R 31/3842; G01R 31/374; G01R 19/16542; G01R 31/392; G01R 31/3646;
(Continued)

(56) References Cited

U.S. PATENT DOCUMENTS

| | | | |
|---|---|---|---|
| 4,290,109 | A | 9/1981 | Taniguchi et al. |
| 4,937,528 | A | 6/1990 | Palanisamy |

(Continued)

FOREIGN PATENT DOCUMENTS

| | | |
|---|---|---|
| CN | 110907848 A | 3/2020 |
| JP | 2003243048 A | 8/2003 |

(Continued)

OTHER PUBLICATIONS

International Search Report for Application No. PCT/KR2021/011405 mailed Dec. 14, 2021, pp. 1-3.
(Continued)

*Primary Examiner* — Julian D Huffman
*Assistant Examiner* — Aiman Bickiya
(74) *Attorney, Agent, or Firm* — Lerner David LLP

(57) ABSTRACT
Provided are a battery pack and a method of controlling the same, in which the battery pack includes a battery module supplying power to a load, a voltage measuring unit measuring a voltage of the battery module, a current measuring unit measuring a current output to the load from the battery module, and a control unit determining whether a cause of an error occurring in the load is the load or the battery pack, based on whether a warning signal corresponding to the voltage of the battery module is generated and whether a current value measured by the current measuring unit for a specific time period satisfies a current profile of the load.

19 Claims, 12 Drawing Sheets

(51) Int. Cl.

| | |
|---|---|
| *B60L 50/60* | (2019.01) |
| *B60L 58/12* | (2019.01) |
| *G01R 31/374* | (2019.01) |
| *H01M 10/46* | (2006.01) |
| *H01M 10/48* | (2006.01) |
| *H02J 7/00* | (2006.01) |
| *H01M 10/42* | (2006.01) |

(52) U.S. Cl.

CPC .......... *G01R 31/374* (2019.01); *H01M 10/46* (2013.01); *H01M 10/482* (2013.01); *H01M 10/486* (2013.01); *H02J 7/0029* (2013.01); *H02J 7/0048* (2020.01); *H02J 7/0063* (2013.01); *H01M 2010/4271* (2013.01); *H01M 2010/4278* (2013.01)

(58) Field of Classification Search

CPC .... G01R 19/165; G01R 31/36; G01R 31/382; G01R 31/387; G01R 31/396; B60L 3/04; B60L 50/60; B60L 58/12; B60L 3/0046; B60L 2240/547; B60L 2240/549; B60L 2240/80; B60L 2250/10; B60L 3/00; B60L 3/0023; B60L 58/10; H01M 10/46; H01M 10/482; H01M 10/486; H01M 2010/4271; H01M 2010/4278; H01M 10/425; H01M 10/48; H01M 10/42; H01M 2220/20; H02J 7/0029; H02J 7/0048; H02J 7/0063; Y02E 60/10; Y02T 10/70; B60Y 2200/91

USPC ........................................................ 320/136

See application file for complete search history.

(56) References Cited

U.S. PATENT DOCUMENTS

| | | | |
|---|---|---|---|
| 6,351,102 B1 * | 2/2002 | Troy .................... | G01R 31/382 320/137 |
| 10,293,701 B2 | 5/2019 | Shin et al. | |
| 2009/0130538 A1 | 5/2009 | Kaita et al. | |
| 2009/0183712 A1 | 7/2009 | Owens et al. | |
| 2009/0184578 A1 | 7/2009 | Owens | |

| | | | |
|---|---|---|---|
| 2009/0184579 A1 | 7/2009 | Owens, Jr. et al. | |
| 2009/0184686 A1 | 7/2009 | Owens, Jr. et al. | |
| 2009/0184692 A1 | 7/2009 | Owens, Jr. et al. | |
| 2009/0184693 A1 | 7/2009 | Owens et al. | |
| 2010/0123465 A1 | 5/2010 | Owens et al. | |
| 2011/0037476 A1 | 2/2011 | Jung et al. | |
| 2012/0217873 A1 | 8/2012 | Tanaka | |
| 2015/0194823 A1 | 7/2015 | Kam et al. | |
| 2016/0204633 A1 | 7/2016 | Furuto | |
| 2016/0380448 A1 | 12/2016 | Seo et al. | |
| 2017/0001536 A1 * | 1/2017 | Seo ..................... | H02J 7/00304 |
| 2019/0212395 A1 | 7/2019 | Chen et al. | |
| 2021/0223320 A1 * | 7/2021 | Lee ..................... | G01R 31/382 |
| 2022/0376519 A1 * | 11/2022 | Lee ..................... | H02J 7/0025 |

FOREIGN PATENT DOCUMENTS

| | | | | | |
|---|---|---|---|---|---|
| JP | 2005125916 A | | 5/2005 | | |
| JP | 2007085772 A | | 4/2007 | | |
| JP | 2007285172 A | | 11/2007 | | |
| JP | 2009258067 A | | 11/2009 | | |
| JP | 2010060381 A | | 3/2010 | | |
| JP | 2011512784 A | | 4/2011 | | |
| JP | 2013226909 A | | 11/2013 | | |
| JP | 2015049611 A | * | 3/2015 | ............. | G01R 31/54 |
| JP | 6091566 B1 | | 3/2017 | | |
| JP | 6241145 B2 | | 12/2017 | | |
| KR | 101099811 B1 | | 12/2011 | | |
| KR | 20140026788 A | | 3/2014 | | |
| KR | 101487577 B1 | | 1/2015 | | |
| KR | 20150081696 A | | 7/2015 | | |
| KR | 101656428 B1 | | 9/2016 | | |
| KR | 20160148933 A | | 12/2016 | | |
| KR | 20170002085 A | | 1/2017 | | |
| KR | 101744713 B1 | | 6/2017 | | |
| KR | 102105821 B1 | | 5/2020 | | |

OTHER PUBLICATIONS

Search Report dated Mar. 3, 2025 from the Office Action for Chinese Application No. 202180031418.7 issued Mar. 6, 2025, pp. 1-3.

Extended European Search Report including Written Opinion for Application No. 21869580.7 dated Dec. 11, 2023, pp. 1-7.

* cited by examiner

START

PERIODICALLY MEASURE VOLTAGE AND
CURRENT OF BATTERY MODULE — S20

CALCULATE SOC OF BATTERY MODULE — S21

EXPECT VOLTAGE OF BATTERY MODULE — S22

S23
EXPECTED VOLTAGE
OF BATTERY MODULE < REFERENCE
VOLTAGE?           No

Yes

GENERATE WARNING SIGNAL — S24

STORE WARNING SIGNAL — S25

END

BATTERY PACK AND METHOD OF CONTROLLING THE SAME

CROSS-REFERENCE TO RELATED APPLICATION

The present application is a national phase entry under 35 U.S.C. § 371 of International Application No. PCT/KR2021/011405 filed Aug. 26, 2021, claims priority from Korean Patent Application No. 10-2020-0119503 filed Sep. 16, 2020, all of which are incorporated herein by reference.

TECHNICAL FIELD

The present disclosure relates to a battery pack and a method of controlling the same. In particular, the present disclosure relates to a battery pack and a method of controlling the same in which an exact cause of an error occurring in a load having the battery pack mounted therein may be identified.

BACKGROUND ART

Recently, with the spread of electronic devices such as smart phones and the development of electric vehicles, research on secondary batteries as power supply sources has also been actively conducted. The secondary battery is provided in the form of a battery pack including a battery module in which a plurality of battery cells are connected in series and/or in parallel, and a battery management system (BMS) that manages an operation of the battery module.

When an error occurs in a load, such as a vehicle, having the battery pack mounted therein, a control system of the load may not identify whether the error occurs because the battery pack is incorrectly used, or whether the error occurs because the battery pack fails to provide sufficient energy. A case where the control system of the load misuses the battery pack corresponds to a case where the battery pack is charged and/or discharged over an output allowable in the battery pack. When the battery pack does not provide sufficient energy, this may correspond to a case where the battery pack fails to satisfy a current profile, etc., which is the output requirements of the load. That is, when an error related to the battery pack occurs in the load, it is difficult to identify whether the cause is in the battery pack or the load.

SUMMARY

Technical Problem

The present disclosure has been made in consideration of these problems, and aims to provide a battery pack and a method of controlling the same, in which when a safety issue occurs in a load, whether a root cause thereof is the battery pack or the load may be identified.

Technical Solution

To solve the technical problem as described above, according to an aspect of embodiments of the present disclosure, there is provided a battery pack including a battery module configured to supply power to a load: a voltage sensor configured to measure a voltage of the battery module; a current sensor configured to measure a current output to the load from the battery module; and a controller configured to determine whether a cause of an error occurring in the load is the load or the battery pack, based on whether a warning signal corresponding to the voltage of the battery module is generated and whether the current output to the load for a specific time period satisfies a current profile of the load.

According to another feature of an embodiment of the present disclosure, the current sensor may be configured to measure a plurality of currents output to the load from the battery module over the specific time period, and when the current profile is provided as described above, the controller may be configured to determine whether the cause of the error is the load or the battery pack, based on whether a warning signal corresponding to the voltage of the battery module is generated and whether a maximum value among the plurality of currents output to the load exceeds a reference current value.

According to further another feature of an embodiment of the present disclosure, the current sensor is configured to measure the current output to the load from the battery module over the specific time period, and the controller may be configure to determine whether the cause of the error is the load or the battery pack, based on whether the warning signal corresponding to the voltage of the battery module is generated and whether a total amount of the current output from the battery module for the specific time period exceeds a reference current amount.

According to further another feature of an embodiment of the present disclosure, the current sensor is configured to measure a plurality of currents output to the load from the battery module over the specific time period, and the controller may be configured to determine whether the cause of the error is the load or the battery pack, based on whether the warning signal corresponding to the voltage of the battery module is generated, whether a maximum value among the plurality of currents output to the load exceeds a reference current value, and whether a total amount of current output from the battery module for the specific time period exceeds a reference current amount.

According to further another feature of an embodiment of the present disclosure, the controller may configured to determine that the cause of the error is the load in response to the warning signal being generated.

According to further another feature of an embodiment of the present disclosure, the controller may be configured to determine that the cause of the error is the battery pack in response to the warning signal not being generated, the maximum value being less than or equal to the reference current value, and the total amount of current being less than or equal to the reference current amount.

According to further another feature of an embodiment of the present disclosure, the controller may be configured to determine that the cause of the error is the load in response to the warning signal not being generated, and either the maximum value exceeding the reference current value or the total amount of current exceeding the reference current amount.

According to further another feature of an embodiment of the present disclosure, the current profile may indicate a minimum condition of current to be output to the load from the battery pack when a predetermined event occurs.

According to further another feature of an embodiment of the present disclosure, the battery pack may further include memory configured to store an error code corresponding to the warning signal and the cause of the error.

According to further another feature of an embodiment of the present disclosure, the memory may be configured to remove the stored error code corresponding to the warning signal in response to the specific time period elapsing.

According to further another feature of an embodiment of the present disclosure, the controller may be configured to generate the warning signal in response to a prediction of the voltage being less than the reference voltage.

According to further another feature of an embodiment of the present disclosure, the controller may be configured to calculate a State of Charge (SOC) of the battery module, and generate the warning signal in response to the voltage of the battery module being less than the reference voltage based on the calculated SOC of the battery module.

According to further another feature of an embodiment of the present disclosure, the battery pack may further include a temperature sensor configured to measure a temperature of the battery module, and the controller may be configured to generate the warning signal in response to a prediction of the voltage of the battery module being less than the reference voltage based on the measured temperature of the battery module.

According to further another feature of an embodiment of the present disclosure, the load may be an electric vehicle.

To solve the technical problem as described above, according to another aspect of embodiments of the present disclosure, there is provided a method of controlling a battery pack, the method including measuring a voltage of a battery module supplying power to a load, measuring a current output to the load from the battery module, generating a warning signal in response to a prediction of the voltage of the battery module being less than a reference voltage, determining whether a maximum value among the measured current values for a specific time period exceeds a reference current value, determining whether a total amount of current output from the battery module for the specific time period exceeds a reference current amount, and determining whether a cause of an error occurring in the load is the load or the battery pack, based on whether the warning signal is generated, whether the maximum value exceeds the reference current value, and whether the total amount of current output from the battery pack for the specific time period exceeds the reference current amount.

Advantageous Effects

With the foregoing configuration, when an error occurs in a load, it is possible to accurately identify where is a root cause of the error, thereby performing appropriate handling of a battery pack after occurrence of the error.

DETAILED DESCRIPTION

Figure 1:
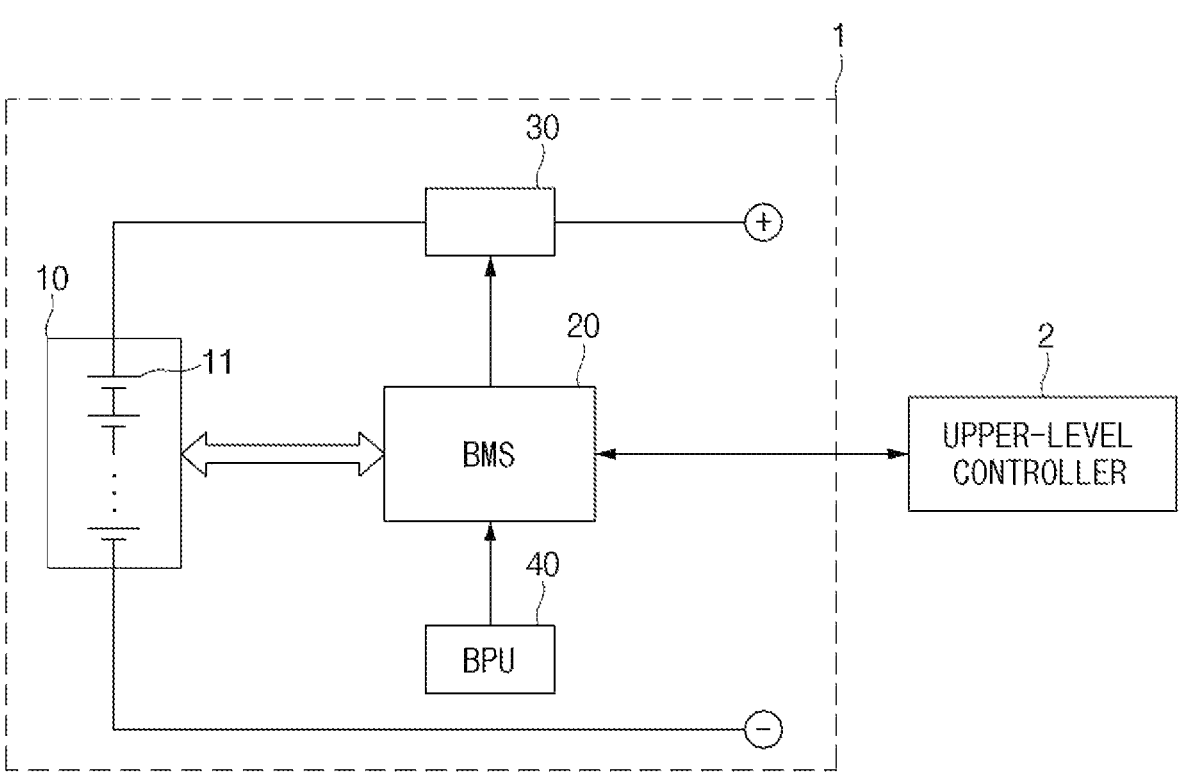
FIG. 1 schematically illustrates a structure of a battery pack according to an embodiment of the present disclosure.

Hereinafter, various embodiments of the present disclosure will be described in detail with reference to the accompanying drawings. In this document, identical reference numerals will be used for identical components in the drawings, and the identical components will not be redundantly described.

For various embodiments of the present disclosure disclosed in this document, specific structural or functional descriptions are only exemplified for the purpose of describing the embodiments of the present disclosure, and various embodiments of the present disclosure may be implemented in various forms, and should not be construed as being limited to the embodiments described in this document.

As used in various embodiments, the terms "1st, "2nd", "first", "second", or the like may modify various components regardless of importance, and do not limit the components. For example, a first component may be named as a second component without departing from the right scope of the present disclosure, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

FIG. 1 illustrates a structure of a battery pack 1 according to an embodiment of the disclosure.

Referring to FIG. 1, the battery pack 1 may include a battery module 10 that includes one or more battery cells 11 and is chargeable/dischargeable, a switching unit 30 serially connected to a positive (+) terminal side or a negative (−) terminal side of the battery module 10 to control a charging/discharging current flow of the battery module 10, and a battery management system (BMS) 20 for control and management to prevent over-charging and over-discharging by monitoring voltage, current, temperature, etc., of the battery cell 11 and/or the battery module 10. The battery pack 1 may further include a battery protection unit (BPU) 40

The battery module 10 may include the one or more battery cells 11 that are chargeable and dischargeable. In the battery module 10, the plurality of battery cells 11 may be connected in series and/or in parallel to each other according to required specifications of the battery pack 1. That is, the number of battery cells 11 and the form of connection therebetween may be determined according to a required output (voltage, current, etc.) of the battery pack 1. An output voltage of the battery module 10 may be supplied as a pack voltage to an outside through a PACK (+) terminal and a PACK (−) terminal, which are output terminals. The battery cell 11 may be a lithium ion (Li-ion) battery, an Li-ion polymer battery, a nickel-cadmium (Ni—Cd) battery, a nickel hydrogen (Ni—MH) battery, etc., and may not be limited thereto when the battery cell 11 is a chargeable battery.

The BMS 20 may control and manage an overall operation of the battery pack 1. The BMS 20 may control an operation of the switching unit 30 to control a charging/discharging operation of the battery module 10. In addition, the BMS 20 may monitor a voltage, a current, a temperature, etc., of the battery module 10 and/or each battery cell included in the battery module 10. A sensor or various measurement modules for monitoring performed by the BMS 20, not shown, may be additionally installed in a random position of the battery module 10, a charging/discharging path, or the battery pack 1, etc. The BMS 20 may calculate a parameter indicating a state of the battery module 10, e.g., an SOC or SOH, etc., based on a measurement value such as monitored voltage, current, temperature, etc. That is, the BMS 20 may function as a voltage measuring unit 21, a current measuring unit 22, and a control unit 23 described below.

The BMS 20 may include various components such as a memory that stores a computer program that is a command for control and management of an overall operation of the battery pack 1, a microcomputer that executes a program and controls an overall operation of the BMS 20 as a controller, an input/output device such as a sensor, a measurement means, etc., and other peripheral circuits, and so forth. Additionally, the BMS 20 may include a circuit configuration for monitoring a voltage, a current, a temperature, etc., of the battery cell as described above.

The switching unit 30 may be a component for controlling a current flow for charging or discharging of the battery module 10. As the switching unit 30, a semiconductor switching element such as a relay, a MOSFET, etc., may be used. An on/off operation of the switching unit 30 may be controlled by the BMS 20.

The battery pack 1 may be further communicatively connected to an external higher-level controller 2. That is, the BMS 20 may transmit various data regarding the battery pack 1 to the higher-level controller 2, and receive a control signal regarding an operation of the battery pack 1 from the higher-level controller 2. The higher-level controller 2 may be a control system provided in the load. The load may be any device in which the battery pack 1 is mounted, such as an electric vehicle, an electric bicycle, etc., to operate by using power supplied by the battery pack 1. When the battery pack 1 is mounted in the electric vehicle, the higher-level controller 2 may be a vehicle controller for controlling driving of the vehicle.

The BPU 40 may include components for a stable operation of the battery pack 1. The BPU 40 may include a cooling means, such as a cooling fan, etc., for controlling a temperature in the battery pack 1. The BPU 40 may also include a fuse for blocking a current path when an overcurrent is generated due to occurrence of a short-circuit or the like.

The BMS 20 according to the present disclosure may determine whether a cause of an error occurring in the load exists in the battery pack 1 side or the load side. That is, the BMS 20 may recognize a root cause of the error occurring in the load. Hereinbelow, a detailed method, performed by the battery pack 1 according to the present disclosure, of recognizing the root cause of the error occurring in the load will be described.

Figure 2:
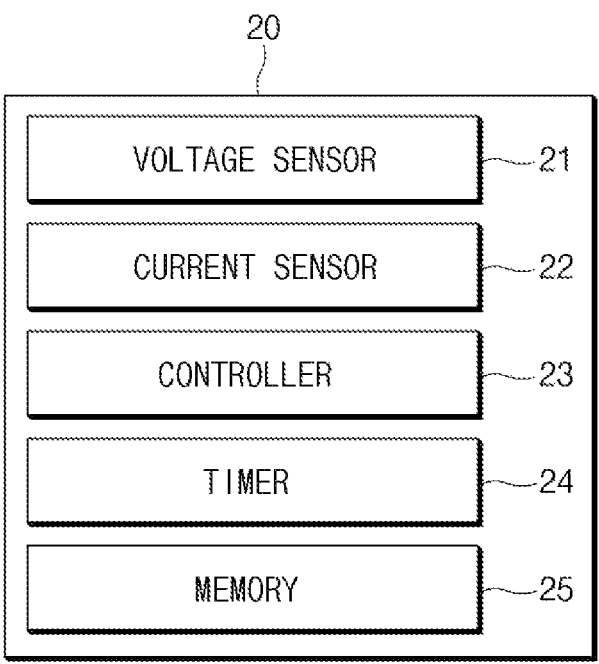
FIG. 2 is a block diagram showing a functional configuration of a battery management system according to an embodiment of the present disclosure.

FIG. 2 is a block diagram showing a functional configuration of the BMS 20 according to an embodiment of the present disclosure.

Referring to FIG. 2, the BMS 20 may include the voltage measuring unit 21, the current measuring unit 22, the control unit 23, a timer 24, and a storing unit 25.

The voltage measuring unit 21 may be configured to measure a voltage of the battery module 10 and/or the battery cell 11. The voltage of the battery module 10 measured by the voltage measuring unit 21 may correspond to a voltage of the battery pack 1. Hereinbelow, it may be described that the voltage measuring unit 21 measures the voltage of the battery module 10.

The voltage measuring unit 21 may periodically measure the voltage of the battery module 10. The voltage measuring unit 21 may measure the voltage of the battery module 10 at predetermined time intervals based on a clock signal provided by the timer 24. For example, the voltage measuring unit 21 may measure the voltage every 0.1 seconds, 1 seconds, 2 seconds, or at random time intervals.

A voltage value measured by the voltage measuring unit 21 may be stored in the storing unit 25 described below. The voltage value stored in the storing unit 25 may be a voltage value measured for a specific time period. The voltage value stored in the storing unit 25 over time may be updated with a voltage value measured for the latest specific time period. That is, a voltage value within a moving window having a length of a specific time period may be stored in the storing unit 25. By storing the voltage value measured for the specific time period in the storing unit 25, it may be possible to unnecessarily waste a storage space.

The current measuring unit 22 may be configured to measure a current output to the load from the battery module 10. The current measuring unit 22 may periodically measure the current output from the battery module 10 to the load. The current measuring unit 22 may measure the voltage of the battery module 10 at predetermined time intervals based on a clock signal provided by the timer 24. For example, the current measuring unit 22 may measure the current every 0.1 seconds, 1 seconds, 2 seconds, or at random time intervals.

A current value measured by the current measuring unit 22 may be stored in the storing unit 25 described below. The current value stored in the storing unit 25 may be a current value measured for a specific time period. The amount of current output from the battery pack 1 to the load for a specific time period, which is calculated based on the current value measured for the specific time period, may be stored in the storing unit 25. The current value and the current amount value stored in the storing unit 25 over time may be updated with a current value measured for the latest specific time period and the calculated current amount value. That is, the current value and the current amount value within a moving window having a length of a specific time period may be stored in the storing unit 25. By storing the current value measured for the specific time period and the current amount value in the storing unit 25, it may be possible to unnecessarily waste a storage space.

The control unit 23 may provide the battery pack 1 including a control unit determining whether a cause of an error occurring in the load is the load or the battery pack 1, based on whether a warning signal corresponding to the voltage of the battery module 10 is generated and whether the current value measured by the current measuring unit 22 for the specific time period satisfies a current profile of the load. The current profile may indicate a minimum condition of current to be output to the load from the battery pack 1 in case of a predetermined event. The error occurring in the load may mean that the voltage output from the battery pack 1 (or the battery module 10) is less than a reference voltage.

Figure 3:
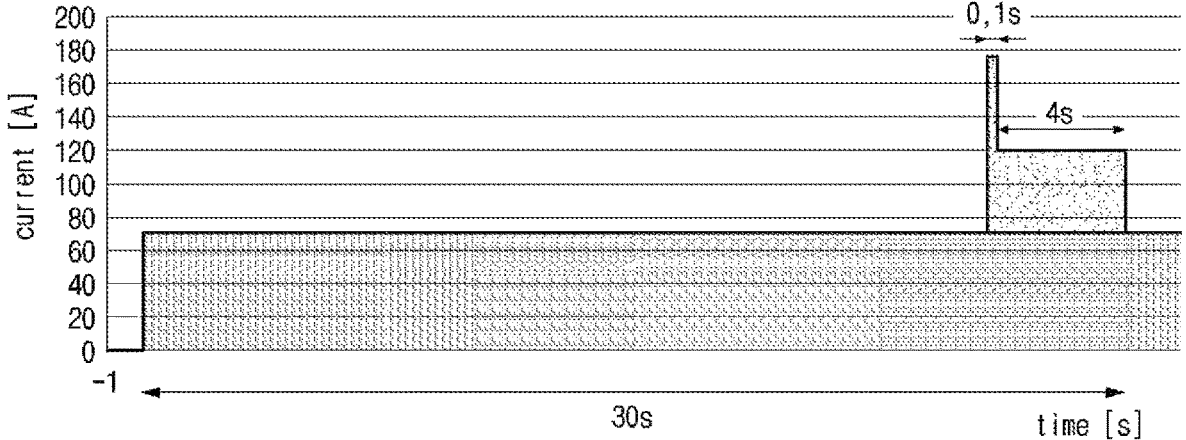
FIG. 3 is a diagram schematically showing an example of a current profile.

FIG. 3 is a diagram schematically showing an example of a current profile. A horizontal axis may indicate time, and a vertical axis may indicate a magnitude of current. FIG. 3 illustrates an example of a current profile in an electric vehicle.

According to the current profile of FIG. 3, the electric vehicle may require the battery pack 1 to output a first reference current for a first reference time when a predetermined situation occurs. The electric vehicle may also require the battery pack 1 to output a second reference current for a second reference time when a predetermined situation occurs. Moreover, the vehicle may also require the battery pack 1 to output a third reference current for a third reference time when a predetermined situation occurs. The first reference current may be 70A, and the first reference time may be 30 seconds. The second reference current may be 120A, and the second reference time may be 4 seconds. The third reference current may be 175A, and the third reference time may be 0.1 second. Each reference current value and reference time value may be examples, without being limited thereto.

When the current profile is provided as described above, the control unit 23 may determine whether the cause of the error is the load or the battery pack 1, based on whether a warning signal corresponding to the voltage of the battery module 10 is generated and whether a maximum value among current values measured by the current measuring unit 22 for the specific time period exceeds a reference current value. Referring to FIG. 3, the control unit 23 may determine whether the cause of the error is the load or the battery pack 1, based on whether the warning signal is generated and whether the maximum value among the current values measured by the current measuring unit 22 for the specific time period exceeds the third reference current. Herein, the specific time period may be, for example, 10 seconds, 20 seconds, 30 seconds, 1 minute, or a random length. The specific time period may be longer than the longest reference time among reference times required in the current profile.

In another example, when the current profile is provided as described above, the control unit 23 may determine whether the cause of the error is the load or the battery pack 1, based on whether the warning signal corresponding to the voltage of the battery module 10 is generated and whether the amount of current output from the battery module 10 for a specific time period exceeds a reference current amount. Referring to FIG. 3, the control unit 23 may determine whether the cause of the error is the load or the battery pack 1, based on whether the warning signal is generated and whether the amount of current output from the battery module 10 exceeds a reference current amount determined as (first reference current*first reference time)+(second reference current*second reference time)+(third reference current*third reference time).

In another example, when the current profile is provided as described above, the control unit 23 may determine whether the cause of the error is the load or the battery pack 1, based on whether the warning signal corresponding to the voltage of the battery module 10 is generated, whether the maximum value among the current values measured by the current measuring unit 22 for a specific time period exceeds a reference current value, and whether the amount of current output from the battery module 10 for a specific time period exceeds a reference current amount. Referring to FIG. 3, the control unit 23 may determine whether the cause of the error is the load or the battery pack 1, based on whether the warning signal is generated, whether the maximum value among the current values measured by the current measuring unit 22 for a specific time period exceeds the third reference current, and whether the amount of current output from the battery module 10 exceeds the reference current amount determined as (first reference current*first reference time)+ (second reference current*second reference time)+(third reference current*third reference time).

In this regard, the control unit 23 may generate the warning signal corresponding to the voltage of the battery module 10. In particular, the control unit 23 may generate the warning signal when the voltage of the battery module 10 is expected to be less than a reference voltage.

In this case, the control unit 23 may calculate an SOC of the battery module 10, and generate the warning signal when the voltage of the battery module 10 is expected to be less than the reference voltage based on the calculated SOC. To this end, the BMS 20 may further include an SOC calculating unit (not shown) configured to calculate the SOC of the battery module 10.

Alternatively, the control unit 23 may measure a temperature of the battery module 10, and generate the warning signal when the voltage of the battery module 10 is expected to be less than the reference voltage based on the measured temperature. To this end, the BMS 20 may further include a temperature measuring unit (not shown) configured to measure the temperature of the battery module 10.

The control unit 23 may determine that the cause of the error is the load when the warning signal is generated.

The control unit 23 may also determine that the cause of the error is the load, when the maximum value measured by the current measuring unit 22 exceeds the reference current value or the amount of current output from the battery module 10 exceeds the reference current amount even though the warning signal is not generated.

On the other hand, the control unit 23 may determine that the cause of the error is the battery pack 1, when the warning signal is not generated and the maximum value measured by the current measuring unit 22 is less than or equal to the reference current value, and the amount of current output from the battery module 10 is less than or equal to the reference current amount.

The timer 24 may be configured to provide a clock signal to the control unit 23. The timer 24 may provide the clock signal to the control unit 23 to allow the voltage measuring unit 21 and the current measuring unit 22 to periodically measure the voltage and current of the battery module 10.

The storing unit 25 may store the voltage value and the current value measured by the voltage measuring unit 21 and the current measuring unit 22, respectively. The storing unit 25 may store a voltage value and a current value for a specific time period. The control unit 23 may remove a voltage value and a current value that are previous to the specific time period over time, and additionally store newly measured voltage value and current value, thereby continuously updating stored data.

The storing unit 25 may be configured to store an error code corresponding to the warning signal generated by the control unit 23 and the cause of the error determined by the control unit 23. In this case, the storing unit 25 may also remove the warning signal after an elapse of the specific time period. The error code may include a first error code indicating that the battery pack 1 is the cause of the error and a second error code indicating that the load is the cause of the error.

As such, the BMS 20 may periodically monitor the voltage and the current of the battery module 10, and determine whether the cause of the error exists in the battery pack 1 side or the load side based on a monitoring value, the warning signal generated based on an expected voltage of the battery module 10, and the current profile. By identifying the exact cause of the error, the occurring error may be accurately dealt with.

Figure 4:
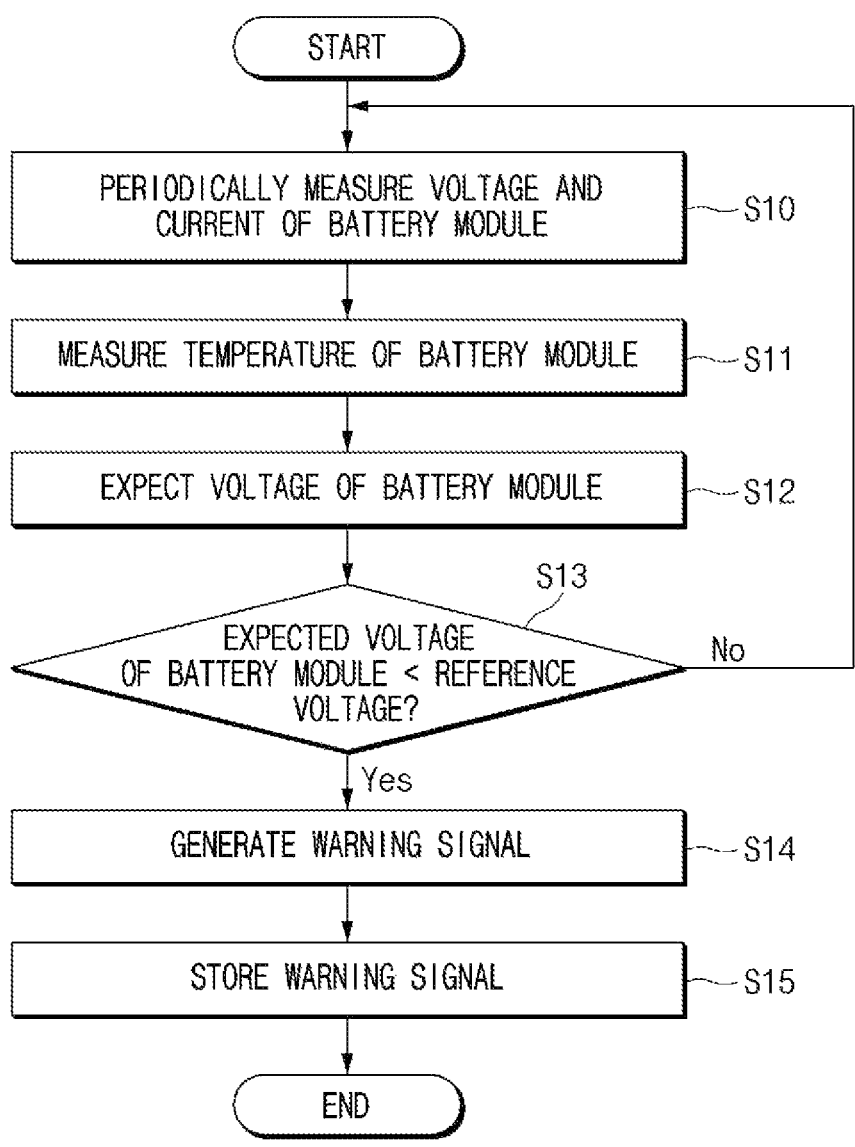
FIG. 4 is a flowchart illustrating an operation of generating a warning signal in a battery pack, according to an embodiment of the present disclosure.

FIG. 4 is a flowchart illustrating an operation of generating a warning signal in the battery pack 1, according to an embodiment of the present disclosure.

Referring to FIG. 4, the control unit 23 may periodically measure voltage and current of the battery module 10 through the voltage measuring unit 21 and the current measuring unit 22, in operation S10. The control unit 23 may also measure a temperature of the battery module 10 through a temperature measuring unit, in operation S11.

The control unit 23 may expect a voltage to be output by the battery module 10 after an elapse of a predetermined time, based on the current voltage of the battery module 10 and the temperature of the battery module 10, in operation S12. That is, the control unit 23 may calculate the expected voltage.

Thereafter, the control unit 23 may determine whether the expected voltage of the battery module 10 is less than a reference voltage, in operation S13. When the expected voltage of the battery module 10 is less than the reference voltage (Yes in operation S13), a warning signal may be generated because an output voltage of the battery pack 1 is likely to drop below the reference voltage, in operation S14. The generated warning signal may be stored in the storing unit 25, in operation S15. The warning signal may be stored in the storing unit 25 for a specific time period and may then be removed later.

Meanwhile, when the expected voltage of the battery module 10 is greater than or equal to the reference voltage (No in operation S13), the warning signal may not be generated and the method may go back to operation S10 because the output voltage of the battery pack 1 is not likely to drop below the reference voltage.

Figure 5:
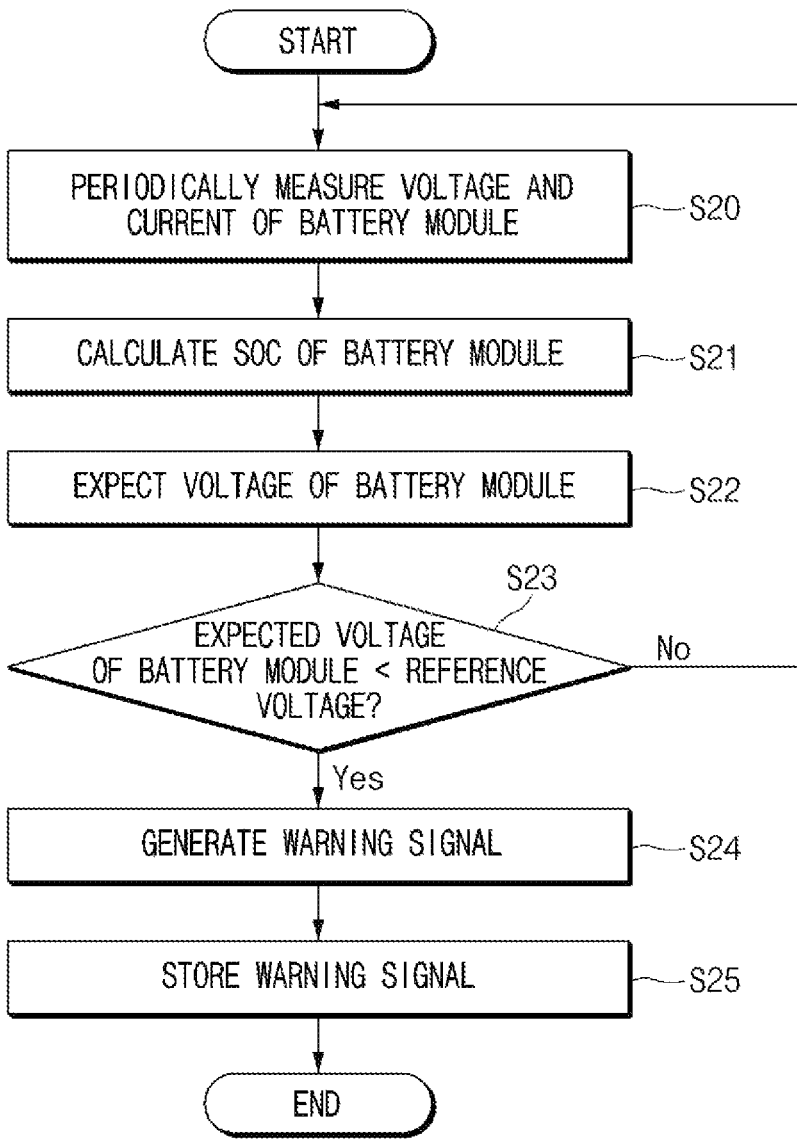
FIG. 5 is a flowchart illustrating an operation of generating a warning signal in a battery pack, according to another embodiment of the present disclosure.

FIG. 5 is a flowchart illustrating an operation of generating a warning signal in the battery pack 1, according to another embodiment of the present disclosure.

Referring to FIG. 5, the control unit 23 may periodically measure voltage and current of the battery module 10 through the voltage measuring unit 21 and the current measuring unit 22, in operation S20. The control unit 23 may calculate an SOC of the battery module 10 through an SOC calculating unit, in operation S21.

The control unit 23 may expect a voltage to be output by the battery module 10 after an elapse of a predetermined time, based on the current voltage of the battery module 10 and the SOC of the battery module 10, in operation S22. That is, the control unit 23 may calculate the expected voltage.

A subsequent operation is the same as operations S13 through S15 of FIG. 4.

While one of the temperature of the battery module 10 and the SOC of the battery module 10 is considered to expect the voltage of the battery module 10 in FIGS. 4 and 5, the present disclosure is not limited thereto. For example, the control unit 23 may calculate the expected voltage by considering both the temperature and the SOC as well as the current voltage of the battery module 10. In addition, parameters other than the temperature and the SOC may be further considered.

Figure 6:
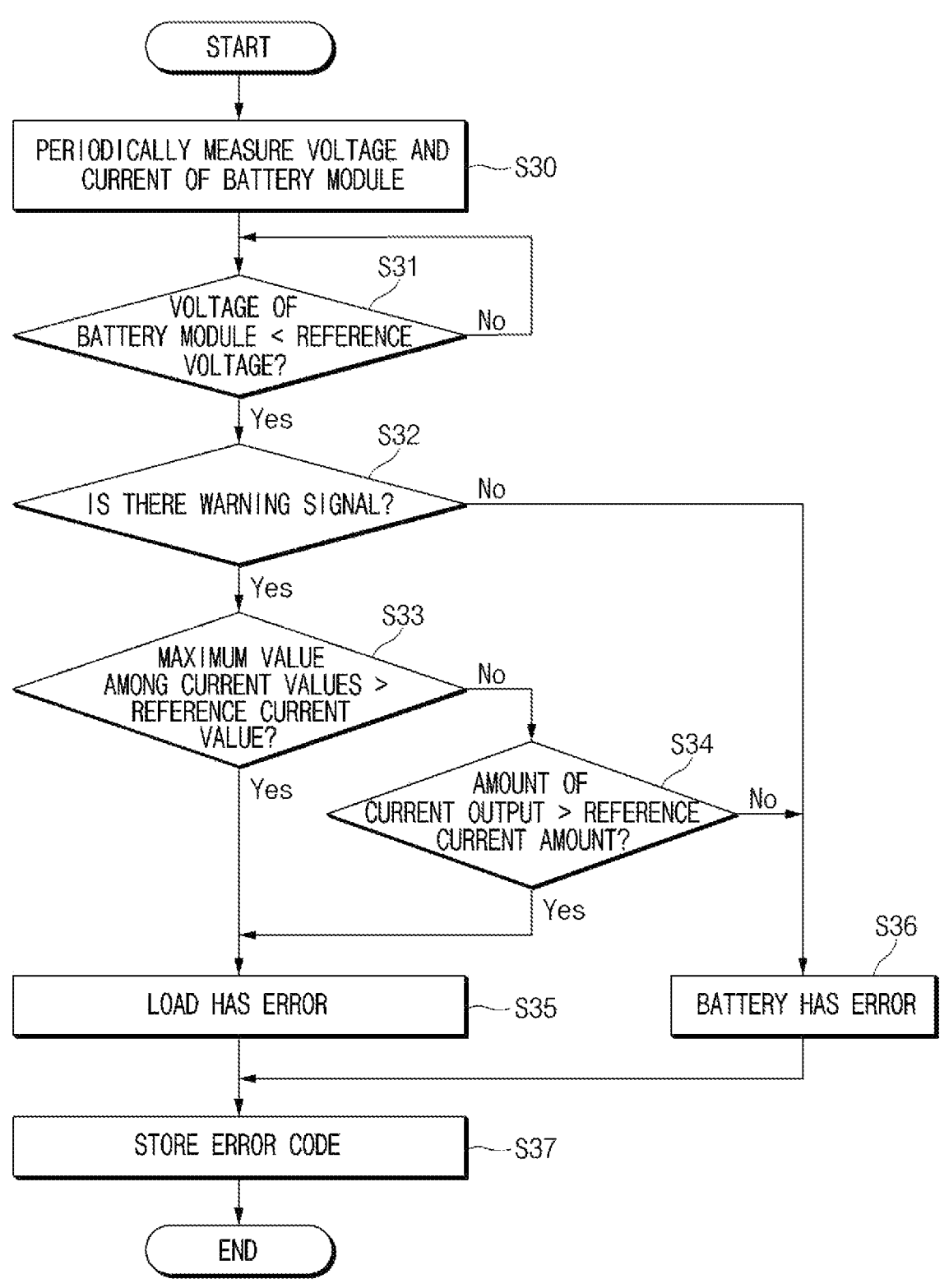
FIG. 6 is a flowchart showing a method of controlling a battery pack according to an embodiment of the present disclosure.

FIG. 6 is a flowchart showing a method of controlling the battery pack according to an embodiment of the present disclosure.

Referring to FIG. 6, the control unit 23 may periodically measure voltage and current of the battery module 10 through the voltage measuring unit 21 and the current measuring unit 22, in operation S30. The control unit 23 may determine whether the voltage of the battery module 10 is less than the reference voltage, in operation S31. When the voltage of the battery module 10 is greater than or equal to the reference voltage (No in operation S31), an error may not occur in the load in relation to the battery pack 1. Thus, in this case, the voltage and the current of the battery module 10 may be continuously measured.

When the voltage of the battery module 10 is less than the reference voltage (Yes in operation S31), an error may occur in the load in relation to the battery pack 1. The control unit 23 may have to determine whether the cause of the occurring error exists in the battery pack 1 side or the load side. Thus, the control unit 23 may first determine whether the warning signal generated for the specific time period is stored in the storing unit 25, in operation S32.

In the absence of the warning signal stored in the storing unit 25 (No in operation S32), the control unit 23 may determine that the error exists in the battery pack 1. That is, the cause of the error (the voltage of the battery module 10 is less than the reference voltage) occurring in the load is the battery pack 1. This is because, when the voltage of the battery module 10 is expected to be less than the reference voltage, the warning signal needs to be generated and transmitted to the load side in advance, but the warning signal has not been so.

When there is a warning signal stored in the storing unit 25 (Yes in operation S32), the control unit 23 may determine whether a maximum value among current values measured for the specific time period exceeds a reference current value, in operation S33. That is, the control unit 23 may determine whether to control the battery pack 1 to output a value greater than a maximum reference current value required in the current profile.

When the maximum value among the current values measured for the specific time period is less than or equal to the reference current value (No in operation S33), the control unit 23 may determine whether the amount of current output from the battery module 10 for the specific time period exceeds the reference current amount in operation S34. The reference current amount may be a current amount output to the maximum limit required in the current profile.

When the amount of current output from the battery module 10 for the specific time period is less than or equal to the reference current amount (No in operation S34), a range of the current output from the battery module 10 may be within a range required in the current profile. Thus, in operation S36, the control unit 23 may determine that the cause of the error is the battery pack 1 because a current output of proper magnitude and amount is required from the battery module 10.

Meanwhile, when the maximum value among the current values measured for the specific time period exceeds the reference current value (Yes in operation S33) and when the amount of current output from the battery module 10 for the specific time period exceeds the reference current amount (Yes in operation S34), the control unit 23 may determine that the cause of the error is the load in operation S35. That is, the current is output from the battery module 10 more than required in the current profile, such that the control unit 23 may determine that the cause of the error exists in the load side, not in the battery pack 1 side.

When the control unit 23 determines that the load or the battery pack 1 has an error in operation S35 or S36, the control unit 23 may store an error code corresponding to the foregoing determination in the storing unit 25. Thus, whether the cause of the error exists in the battery pack 1 side or in the load side may be determined based on the error code, and thus the error may be appropriately handled.

Figure 7A:
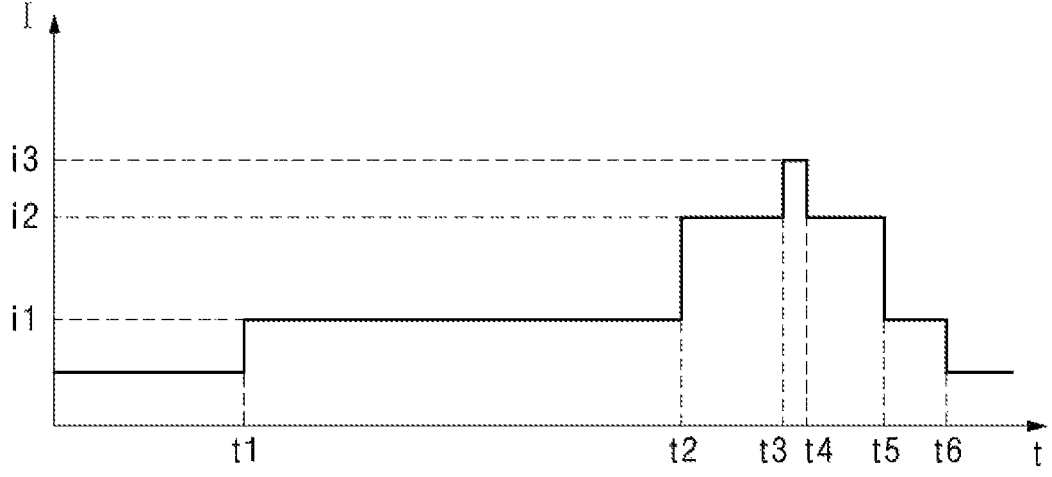
FIGS. 7A through 7C are diagrams for describing a method of determining a cause of an error.
Figure 7A:
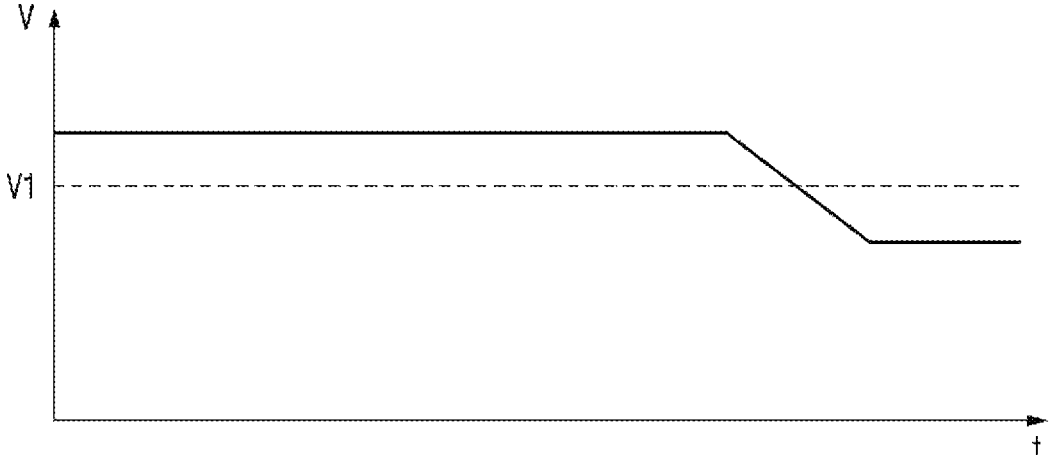
Figure 7B:
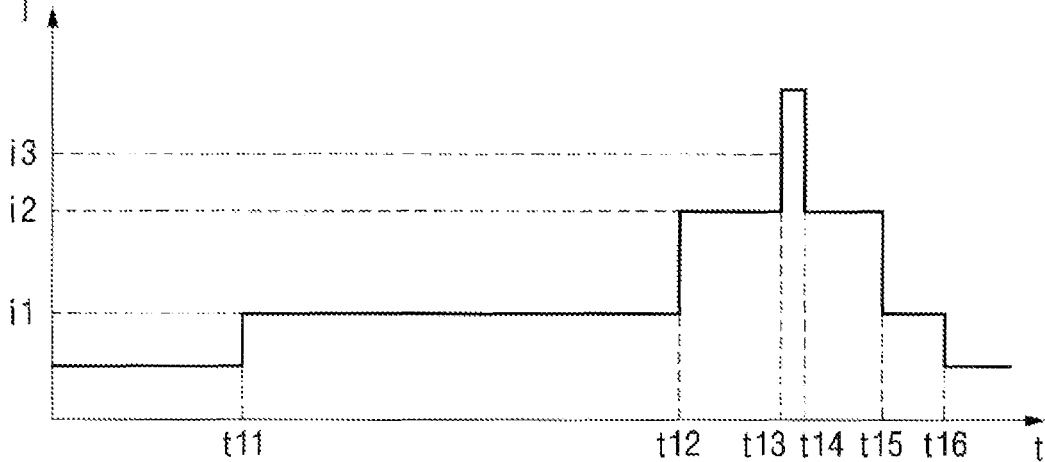
Figure 7B:
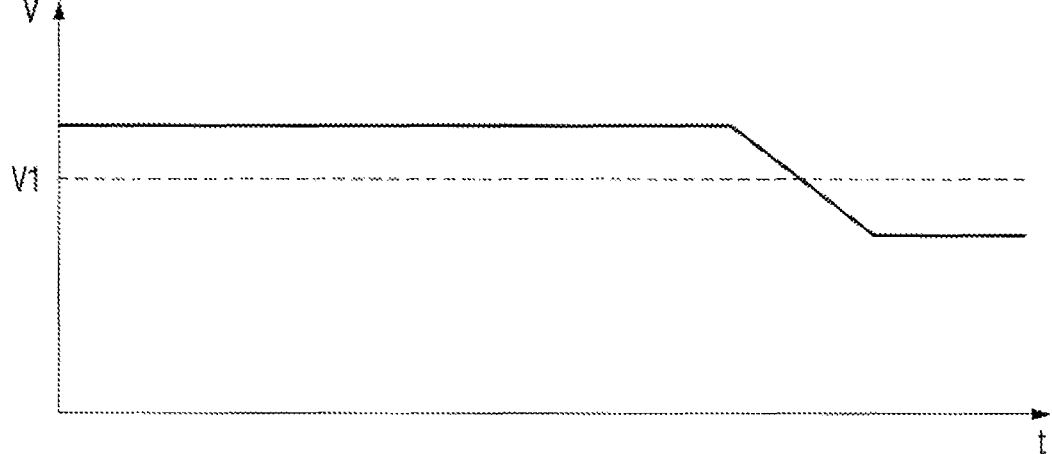
Figure 7C:
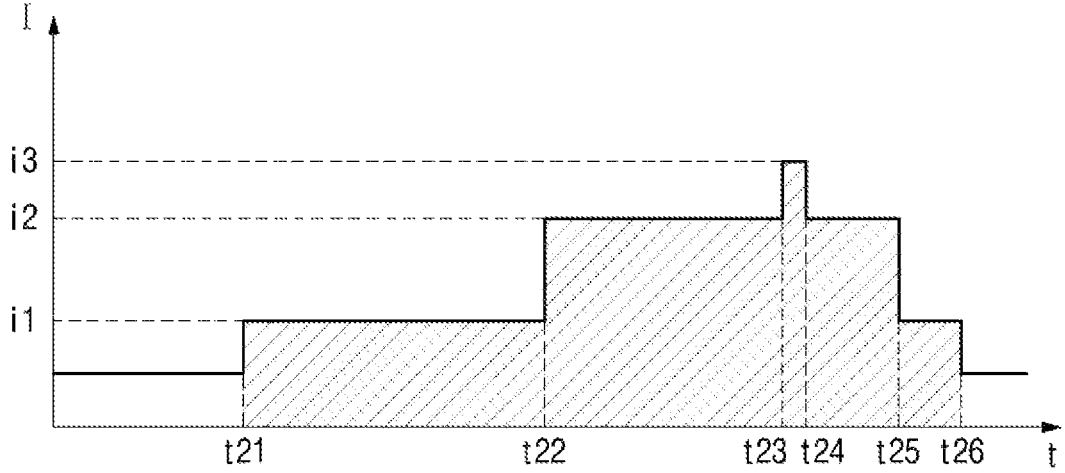
Figure 7C:
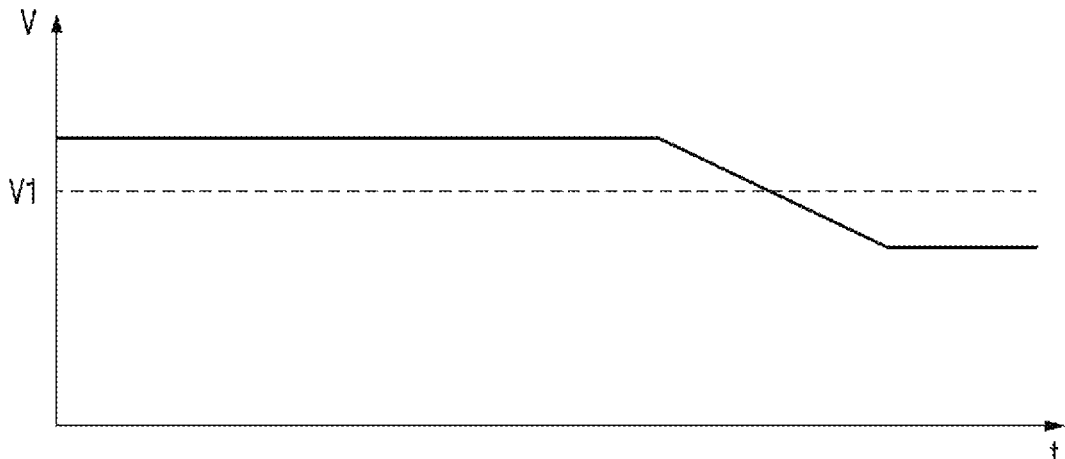

FIGS. 7A through 7C are diagrams for describing a method of determining a cause of an error. FIGS. 7A through 7C show current values measured by the current measuring unit 22. FIGS. 7A through 7C may be limited to a case where a warning signal is generated and stored. The current profile requires outputting of a first reference current i1, a second reference current i2, and a third reference current i3.

Referring to FIG. 7A, current output from the battery module 10 may be the first reference current i1, the second reference current i2, or the third reference current i3 required in the current profile. A sum of lengths of t1 to t2 and t5 to t6 that are times in which the first reference current i1 is output may be less than a first reference time. A sum of lengths of t2 to t3 and t4 to t5 that are times in which the second reference current i2 is output may be less than a second reference time. A length of t3 to t4 that is a time in which the third reference current i3 is output may be less than a third reference time.

As such, in a situation where the current is output, the voltage of the battery module 10 may drop below a reference voltage V1, such that an error may occur in the load.

In this case, the current output from the battery module 10 may be within the range required by the current profile, and thus the cause of the error may be determined to exist in the battery pack 1 side. This may correspond to a determination that the battery pack 1 has an error by No of operation S33 and No of operation S34 in FIG. 6.

Referring to FIG. 7B, current output from the battery module 10 may be the first reference current i1 or the third reference current i3 required in the current profile. However, current exceeding the second reference current i2 may be output in a time period of t13 to t14.

A sum of lengths of t11 to t12 and t15 to t16 that are times in which the first reference current i1 is output may be less than the first reference time. A sum of lengths of t12 to t13 and t14 to t15 that are times in which the second reference current i2 is output may be less than the second reference time. A length of t13 to t14 that is a time in which the third reference current i3 is output may be less than the third reference time.

In a situation where the current is output, the voltage of the battery module 10 may drop below the reference voltage V1, such that an error may occur in the load.

In this case, the maximum current output from the battery module 10 exceeds a reference current required in the current profile, and thus falls out of the range required in the current profile. Thus, the cause of the error may be determined to exist in the load side. This may correspond to a determination that the load has an error by Yes of operation S33 in FIG. 6.

Referring to FIG. 7C, current output from the battery module 10 may be the first reference current i1, the second reference current i2, or the third reference current i3 required in the current profile. A sum of lengths of t21 to t22 and t25 to t26 that are times in which the first reference current i1 is output may be less than the first reference time. A length of t23 to t24 that is a time in which the third reference current i3 is output may be less than the third reference time. A sum of lengths of t22 to t23 and t24 to t25 that are times in which the second reference current i2 is output may be less than the second reference time.

In a situation where the current is output, the voltage of the battery module 10 may drop below a reference voltage V1, such that an error may occur in the load.

In this case, the maximum current output from the battery module 10 exceeds a current amount required in the current profile, and thus falls out of the range required in the current profile. Thus, the cause of the error may be determined to exist in the load side. This may correspond to a determination that the load has an error by Yes of operation S34 in FIG. 6.

As such, the BMS 20 may periodically monitor the voltage and the current of the battery module 10, and determine whether the cause of the error exists in the battery pack 1 side or the load side based on a monitoring value, the warning signal generated based on an expected voltage of the battery module 10, and the current profile. By identifying the exact cause of the error, the occurring error may be accurately dealt with.

Figure 8:
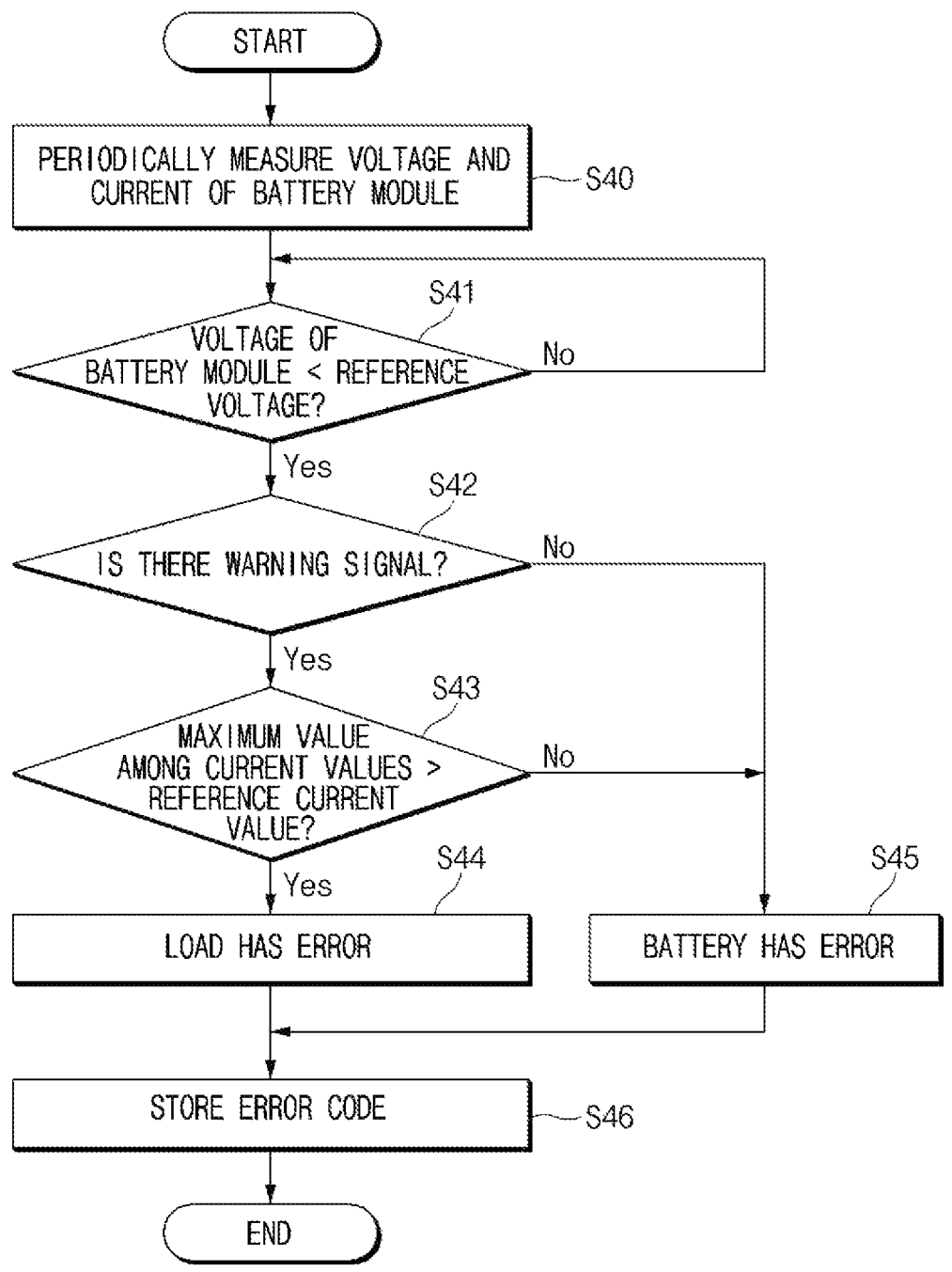
FIG. 8 is a flowchart showing a method of controlling a battery pack according to another embodiment of the present disclosure.

FIG. 8 is a flowchart showing a method of controlling the battery pack 1 according to another embodiment of the present disclosure.

In the current embodiment, the method may include operation S42 in which the control unit 23 determines whether there is a warning signal and operation S43 in which a maximum value among current values measured for a specific time period exceeds a reference current value. That is, the current embodiment may be different from the embodiment of FIG. 6 in that the operation of determining whether the amount of current output from the battery module for the specific time period exceeds the reference current amount is omitted.

According to the current embodiment, the exact cause of the error may be identified like in the embodiment of FIG. 6.

Figure 9:
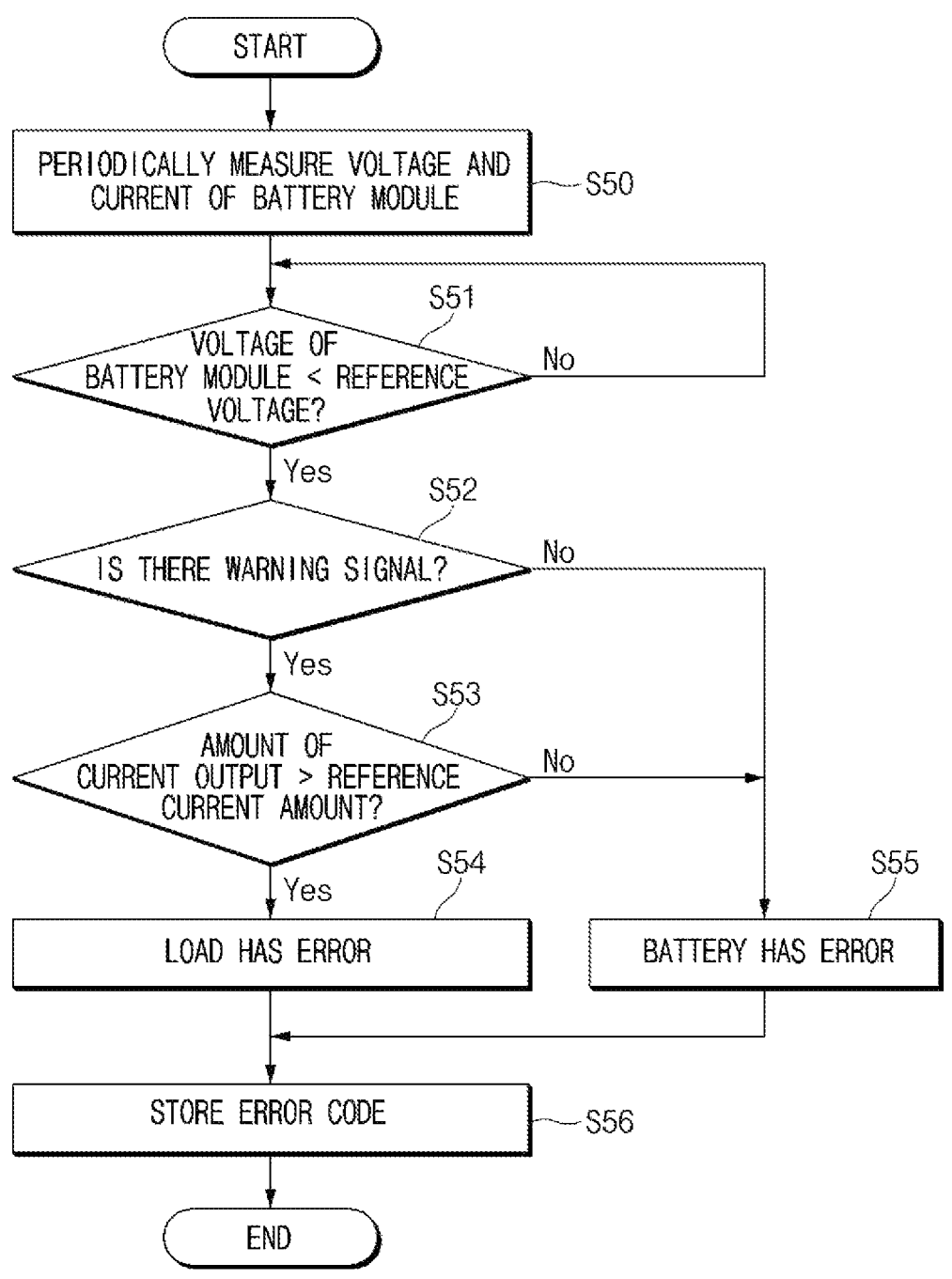
FIG. 9 is a flowchart showing a method of controlling a battery pack according to another embodiment of the present disclosure.

FIG. 9 is a flowchart showing a method of controlling the battery pack 1 according to another embodiment of the present disclosure.

In the current embodiment, the method may include operation S52 in which the control unit 23 determines whether there is a warning signal and operation S53 in which the amount of current output from the battery module for a specific time period exceeds a reference current amount. That is, the current embodiment may be different from the embodiment of FIG. 6 in that the operation of determining whether the maximum value among the current values measured for the specific time period exceeds the reference current value is omitted.

According to the current embodiment, the exact cause of the error may be identified like in the embodiment of FIG. 6.

Figure 10:
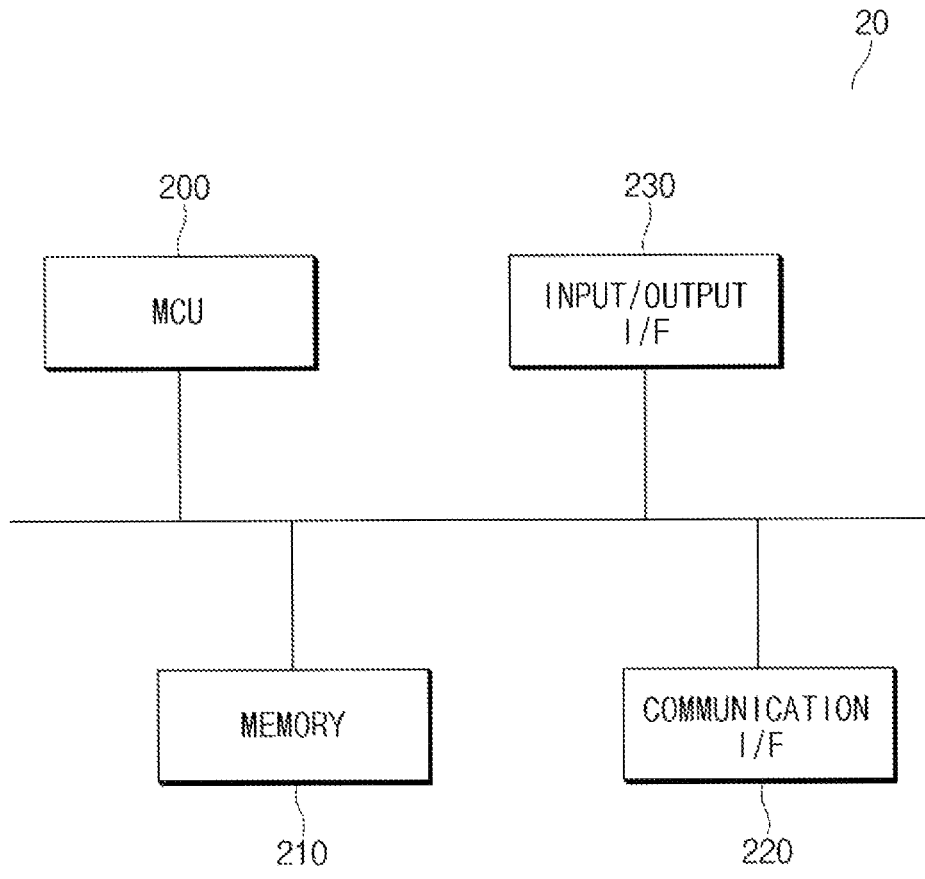
FIG. 10 shows a hardware configuration of a battery management system according to an embodiment of the present disclosure.

FIG. 10 shows a hardware configuration of the BMS 20 according to an embodiment of the present disclosure.

Referring to FIG. 10, the BMS 20 may include a controller (a micro control unit (MCU)) 200, a memory 210, a communication interface (communication I/F) 220, and an input/output interface (input/output I/F) 230.

The MCU 200 may process various operations and calculations in the BMS 20 and control each component.

In the memory 210, an operating system program and a program for performing a function of the MCU 200 may be recorded. The memory 210 may include a volatile memory and a nonvolatile memory. For example, at least one of various storage media such as a semiconductor memory like random-access memory (RAM), read-only memory (ROM), flash memory, etc., and a magnetic disk, an optical disk, etc., may be used as the memory 210. The memory 210 may be a memory embedded in the MCU 200 or an additional memory installed separately from the MCU 200.

The communication interface 220 may be a component that is capable of wiredly and/or wirelessly communicating with an outside.

The input/output interface 230 may perform inputting/outputting of various input signals and output signals.

As the MCU 200 executes a program stored in the memory 210, the MCU 200 may perform functions of the control unit 23 and the SOC calculating unit of the BMS 20, etc. In addition, the MCU 200 may function as the voltage measuring unit 21, the current measuring unit 22, and the voltage measuring unit, based on a program stored in the memory 210 and various measurement signals received through the input/output interface 230.

The memory 210 may function as the storing unit 25. The MCU 200 may function as a communication means communicating with the higher-level controller 2 by operating together with the communication interface 220.

Terms such as "include", "constitute" or "have" described above may mean that the corresponding component may be inherent unless otherwise stated, and thus should be construed as further including other components rather than excluding other components. All terms including technical or scientific terms may be interpreted as having the same meanings as those generally understood by those of ordinary skill in the art unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present disclosure.

The above description is merely illustrative of the technical idea of the present disclosure, and various modifications and variations will be possible without departing from the essential characteristics of the present disclosure by those of ordinary skill in the art to which the present disclosure pertains. Therefore, the embodiments disclosed in the present disclosure are intended for description rather than limitation of the technical spirit of the present disclosure, and the scope of the technical spirit of the present disclosure is not limited by these embodiments. The protection scope of the present disclosure should be interpreted by the following claims, and all technical spirits within the same range should be understood to be included in the range of the present disclosure.

The invention claimed is:

1. A battery pack comprising:

a battery module configured to supply power to a load;

a voltage sensor configured to measure a voltage of the battery module;

a current sensor configured to measure a current output to the load from the battery module; and a controller configured to:

determine whether a cause of an error occurring in the load is the load or the battery pack, based on whether a warning signal corresponding to the voltage of the battery module is generated and whether the current output to the load for a specific time period satisfies a current profile of the load; and control an operation of the battery pack to handle the error based on the determined cause of the error.

2. The battery pack of claim 1, wherein the current sensor is configured to measure a plurality of currents output to the load from the battery module over the specific time period, and wherein the controller is configured to determine whether the cause of the error is the load or the battery pack, based on whether the warning signal corresponding to the voltage of the battery module is generated and whether a maximum value among the plurality of currents output to the load exceeds a reference current value.

3. The battery pack of claim 1, wherein the current sensor is configured to measure the current output to the load from the battery module over the specific time period, and wherein the controller is configured to determine whether the cause of the error is the load or the battery pack, based on whether the warning signal corresponding to the voltage of the battery module is generated and whether a total amount of the current output from the battery module for the specific time period exceeds a reference current amount.

4. The battery pack of claim 1, wherein the current sensor is configured to measure a plurality of currents output to the load from the battery module over the specific time period, and wherein the controller is configured to determine whether the cause of the error is the load or the battery pack, based on whether the warning signal corresponding to the voltage of the battery module is generated, whether a maximum value among the plurality of currents output to the load exceeds a reference current value, and whether a total amount of current output from the battery module for the specific time period exceeds a reference current amount.

5. The battery pack of claim 4, wherein the controller is configured to determine that the cause of the error is the load in response to the warning signal being generated.

6. The battery pack of claim 4, wherein the controller is configured to determine that the cause of the error is the battery pack in response to the warning signal not being generated, the maximum value being less than or equal to the reference current value, and the total amount of current being less than or equal to the reference current amount.

7. The battery pack of claim 4, wherein the controller is configured to determine that the cause of the error is the load in response to the warning signal not being generated, and either the maximum value exceeding the reference current value or the total amount of current exceeding the reference current amount.

8. The battery pack of claim 1, wherein the current profile indicates a minimum condition of current to be output to the load from the battery pack when a predetermined event occurs.

9. The battery pack of claim 1, further comprising memory configured to store an error code corresponding to the warning signal and the cause of the error.

10. The battery pack of claim 9, wherein the memory is configured to remove the stored error code corresponding to the warning signal in response to the specific time period elapsing.

11. The battery pack of claim 1, wherein the controller is configured to generate the warning signal in response to a prediction of the voltage being less than a reference voltage.

12. The battery pack of claim 11, wherein the controller is configured to calculate a State of Charge (SOC) of the battery module, wherein the controller is configured to generate the warning signal in response to a prediction of the voltage of the battery module being less than the reference voltage based on the calculated SOC of the battery module.

13. The battery pack of claim 11, further comprising a temperature sensor configured to measure a temperature of the battery module, wherein the controller is configured to generate the warning signal in response to a prediction of the voltage of the battery module being less than the reference voltage based on the measured temperature of the battery module.

14. The battery pack of claim 1, wherein the battery module is configured to supply power to an electric vehicle.

15. An electric vehicle, comprising the battery pack of claim 1, wherein the load comprises the electric vehicle.

16. The battery pack of claim 1, wherein the controller is configured to control operation of the battery pack to prevent over-charging or over-discharging of the battery module based on the cause of the error being the load.

17. The battery pack of claim 1, further comprising a switch connected to a terminal of the battery module, wherein the switch controls a charging/discharging current flow of the battery module, and wherein the controller is configured to control operation of the switch to prevent the over-charging or the over-discharging of the battery module based on the cause of the error being the load.

18. The battery pack of claim 1, further comprising a memory device, wherein the controller is configured to output an error code corresponding to the determine cause of the error to the memory device for storage.

19. A method of controlling a battery pack, the method comprising:

measuring a voltage of a battery module supplying power to a load;

measuring a current output to the load from the battery module;

generating a warning signal in response to a prediction of the voltage of the battery module being less than a reference voltage;

determining whether a maximum value among the measured current values for a specific time period exceeds a reference current value;

determining whether a total amount of current output from the battery module for the specific time period exceeds a reference current amount; and determining whether a cause of an error occurring in the load is the load or the battery pack, based on whether the warning signal is generated, whether the maximum value exceeds the reference current value, and whether the total amount of current output from the battery pack for the specific time period exceeds the reference current amount; and controlling an operation of the battery pack to handle the error based on the determined cause of the error.

* * * * *